United States Patent [19]

Barre

[11] Patent Number: 5,331,229
[45] Date of Patent: Jul. 19, 1994

[54] CMOS/ECL SIGNAL LEVEL CONVERTER

[75] Inventor: Claude Barre, Munich, Fed. Rep. of Germany

[73] Assignee: Siemens Aktiengesellschaft, Munich, Fed. Rep. of Germany

[21] Appl. No.: 869,472

[22] Filed: Apr. 15, 1992

[30] Foreign Application Priority Data

Apr. 15, 1991 [DE] Fed. Rep. of Germany ....... 4112310

[51] Int. Cl.$^5$ .......................................... H03K 17/0.75
[52] U.S. Cl. .................................... 307/475; 307/455; 307/446
[58] Field of Search ................. 307/455, 446, 443, 475

[56] References Cited

U.S. PATENT DOCUMENTS

| | | | |
|---|---|---|---|
| 4,450,371 | 5/1984 | Bismark | 307/475 |
| 4,713,560 | 12/1987 | Herndon | 307/455 |
| 4,999,519 | 3/1991 | Kitsukawa et al. | 307/455 |
| 5,023,479 | 6/1991 | Jeffery et al. | 307/455 |
| 5,172,015 | 12/1992 | Barre | 307/455 |

FOREIGN PATENT DOCUMENTS

| | | |
|---|---|---|
| 0208397 | 1/1987 | European Pat. Off. |
| 3929351 | 10/1990 | Fed. Rep. of Germany |
| 9010134 | 10/1990 | Fed. Rep. of Germany |
| 2519211 | 7/1983 | France |
| 294811 | 4/1990 | Japan |

OTHER PUBLICATIONS

"BiCMOS Emitter-Coupled Logic Converter For Extended Voltage Operation" p. 388, vol. 33, No. 10B, Mar. 1991.
U.S. application Ser. No. 725,429, filed Jul. 1991, Oezoguz-Geissler.
U.S. application Ser. No. 577,472, filed Sep. 1990, Barre.

Primary Examiner—Edward P. Westin
Assistant Examiner—Andrew Sanders
Attorney, Agent, or Firm—Herbert L. Lerner; Laurence A. Greenberg

[57] ABSTRACT

A signal level converter for converting CMOS input signal levels to ECL output signal levels includes first and second transistors having emitters connected to each other. The collector of the first transistor is directly connected to a first supply voltage potential. A first resistor is connected between the collector of the second transistor and the first supply voltage potential. The base of the second transistor is connected to a reference potential. A third transistor has a collector connected to the emitters of the first and second transistors. A second resistor is connected between the emitter of the third transistor and a second supply voltage potential. The base of the third transistor is connected to a control potential. A fourth transistor has a collector connected to the first supply voltage potential and a base connected to the collector of the second transistor. An input signal terminal is connected to the base of the first transistor, and an output signal terminal is connected to the emitter of the fourth transistor. The first resistor is a controllable resistor being controlled for having a high resistance when current flowing through the collector-to-emitter path of the third transistor flows through the collector-to-emitter path of the second transistor, and having a low resistance when that current flows through the collector-to-emitter path of the first transistor.

5 Claims, 2 Drawing Sheets

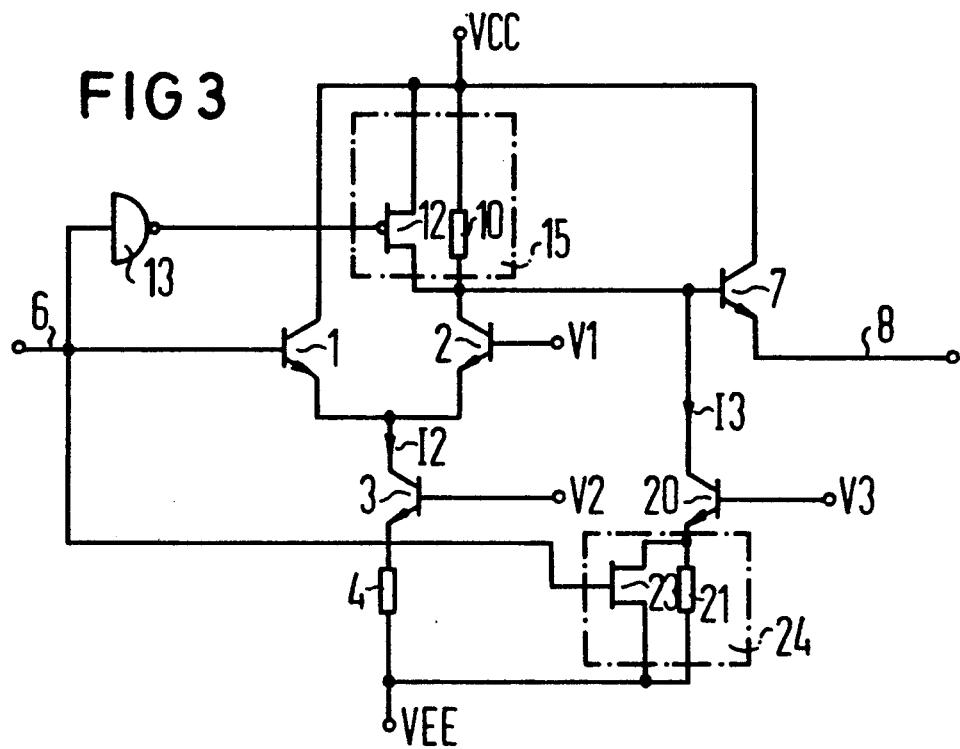
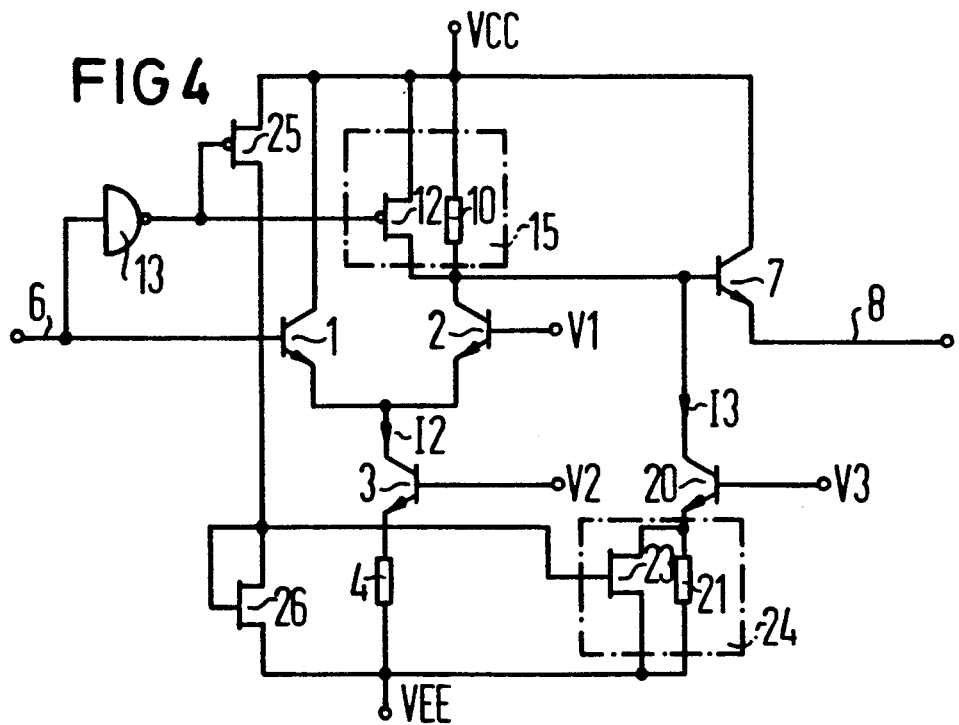

CMOS/ECL SIGNAL LEVEL CONVERTER

The invention relates to a signal level converter for converting CMOS input signal levels to ECL output signal levels, having the following characteristics:

- of two emitter-coupled transistors, the collector of the first transistor is connected directly and the collector of the second transistor is connected through a resistor, to a first supply voltage potential;
- the emitters of the first two transistors are connected to the collector of a third transistor, which is connected through an emitter-side resistor to a second supply voltage potential;
- the base terminals of the second and third transistors are respectively connected to a reference and a control potential;
- the base of a fourth transistor is connected to the collector of the second transistor and its collector is connected to the first supply voltage potential;
- an input signal terminal is connected to the base of the first transistor and an output signal terminal is connected to the emitter of the fourth transistor.

In the production of digital electronic systems, fast logic switching stages are typically made with bipolar emitter-coupled logic (ECL), which is intensive in terms of power loss, and slower switching stages are made by complimentary MOS circuitry (CMOS), which is low in power loss. Since the two circuit technologies use different voltage levels for the logic signals L and H, signal level converters must be used at the transition from CMOS to ECL switching stages. As a rule, the CMOS and ECL switching stages are each made on different ICs, that are disposed on printed wiring boards and connected to one another through conductor tracks.

Due to the low signal level modulation and the possibility of adapting the output of the signal level converter to the wave resistance of the conductor tracks, ECL signal levels are more suitable than CMOS signal levels for the signal transmission to the printed wiring board. It is accordingly recommended that the signal level converter be disposed on whichever IC includes the CMOS switching stages.

In prior art signal level converters, such as the one described below with regard to FIG. 1, the minimum power loss is relatively high.

It is accordingly an object of the invention to provide a signal level converter, which overcomes the hereinafore-mentioned disadvantages of the heretofore-known devices of this general type and which does so in such a way that the power loss is reduced.

With the foregoing and other objects in view there is provided, in accordance with the invention, a signal level converter for converting CMOS input signal levels to ECL output signal levels, comprising first and second transistors having bases and having collectors and emitters defining collector-to-emitter paths, the emitters of the first and second transistors being connected to each other, the collector of the first transistor being directly connected to a first supply voltage potential, a first resistor connected between the collector of the second transistor and the first supply voltage potential, the base of the second transistor being connected to a reference potential; a third transistor having a base and having a collector and an emitter defining a collector-to-emitter path, the collector of the third transistor being connected to the emitters of the first and second transistors, a second resistor connected between the emitter of the third transistor and a second supply voltage potential, and the base of the third transistor being connected to a control potential; a fourth transistor having a collector connected to the first supply voltage potential, a base connected to the collector of the second transistor and an emitter; an input signal terminal connected to the base of the first transistor, an output signal terminal connected to the emitter of the fourth transistor; and the first resistor being a controllable resistor being controlled for having a high resistance when current flowing through the collector-to-emitter path of the third transistor flows through the collector-to-emitter path of the second transistor, and having a low resistance when the current flowing through the collector-to-emitter path of the third transistor flows through the collector-to-emitter path of the first transistor.

In accordance with another feature of the invention, there is provided an inverter, the controllable resistor having an ohmic resistor and an MOS transistor with a drain-to-source path forming a parallel circuit with the ohmic resistor and a gate electrode connected through the inverter to the input signal terminal.

In accordance with a further feature of the invention, the controllable resistor is a first controllable resistor, and there is provided a second controllable resistor being controlled in the same direction or sense as the first controllable resistor, and a fifth transistor having a collector connected to the base of the fourth transistor, an emitter connected through the second controllable resistor to the second supply voltage potential and a base connected to a further control potential.

In accordance with an added feature of the invention, the second controllable resistor includes an ohmic resistor and an MOS transistor having a drain-to-source path forming a parallel circuit with the ohmic resistor and a gate electrode connected to the input signal terminal.

In accordance with an additional feature of the invention, there is provided an inverter connected to the input signal terminal; the controllable resistor being a first controllable resistor having a first ohmic resistor and a first MOS transistor with a drain-to-source path forming a parallel circuit with the first ohmic resistor and a gate electrode connected to the inverter; a second controllable resistor being controlled in the same direction as the first controllable resistor and having a second ohmic resistor and a second MOS transistor with a drain-to-source path forming a parallel circuit with said second ohmic resistor; a fifth transistor having a collector connected to the base of the fourth transistor, an emitter connected through the second controllable resistor to the second supply voltage potential and a base connected to a further control potential; third and fourth MOS transistor having drain and source terminals defining drain-to-source paths being connected in a series circuit at a connecting point, the source terminal of the third MOS transistor being connected to the first supply voltage potential, the source terminal of the fourth MOS transistor being connected to the second supply voltage potential; the gate electrode of the first MOS transistor being connected to the gate electrode of the third MOS transistor; the-gate electrode of the second MOS transistor being connected to the connecting point between the third and fourth MOS transistors; and the gate and drain electrodes of the fourth MOS transistor being connected to one another.

In accordance with a concomitant feature of the invention, the first and second MOS transistors have opposite polarities; and the third and fourth MOS transistors have the same polarities as the first and second MOS transistors.

Other features which are considered as characteristic for the invention are set forth in the appended claims.

Although the invention is illustrated and described herein as embodied in a signal level converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 3 is a circuit diagram of a signal level converter that is improved in accordance with the invention, with only a slight power loss and with output signal levels which are independent of temperature; and FIG. 4 is a circuit diagram of this kind of signal level converter with additional compensation of variation on the part of production-dependent parameters of MOS transistors.

Figure 1:
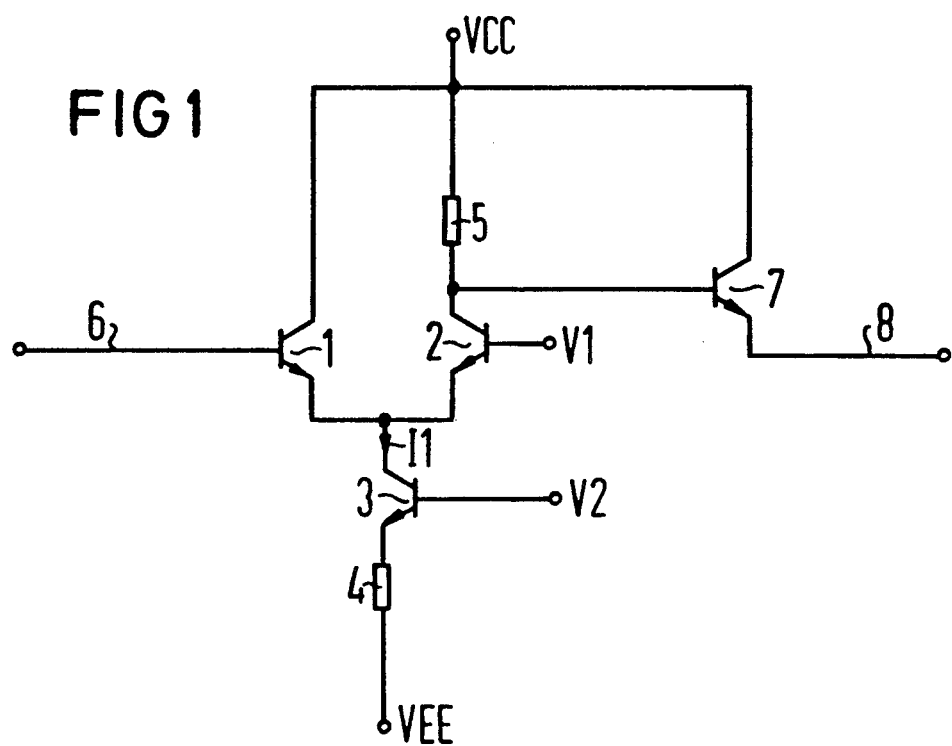
FIG. 1 is a schematic circuit diagram of a prior art signal level converter.

Referring now to the figures of the drawing in detail and first, particularly, to FIG. 1 thereof, there is seen a known signal level converter which may be made in BiCMOS technology, in which MOS and bipolar transistors can be disposed on the same IC. The emitters of two emitter-coupled transistors 1, 2 are connected to a supply potential VEE through a current source that includes a transistor 3 and a second resistor 4. The current source impresses a current I1. The collector of the transistor 1 is connected directly, and the collector of the transistor 2 is connected through a first resistor 5, to a further supply potential VCC. The base of the transistor 2 is connected to a reference potential V1, which is located in the middle of the potentials VCC, VEE. An input signal terminal 6 of the level converter is connected to the base of the transistor 1. The signal levels for input signals H and L, are at the value of the respective potentials VCC and VEE, for instance 0 V and −5 V.

The base of a further transistor 7, which operates as an emitter follower, is connected to the collector of the transistor 2. The emitter of the transistor 7 forms an output signal terminal 8. The ECL signal levels for the output signal are at −0.9 V for H and −1.7 V for L, for example.

The current I1 flows through the transistor 1 when there is an H level at the circuit input signal terminal 6 and it flows through the transistor 2 when there is an L signal. If the input signal is at H potential, then on one hand the base current of the transistor 7 must be dimensioned in such a way that the current intensity at the output signal terminal 8 amounts to from 20 mA to 25 mA. This is equivalent to the typical value for a printed wiring board having a wave resistance of 50 Ohms. On the other hand, the voltage drop at the resistor 5 which is brought about by the base current of the transistor 7 and the voltage drop at the base-to-emitter path of the transistor 7, result in a value of −0.9 V. As a result, a maximum value of 200 Ohms, for instance, is defined for the resistor 5. If the input signal is at L potential, then the current I1 additionally flows through the resistor 5. The current I1 must be selected in such a way that a level modulation from −0.9 V to −1.7 V occurs at the collector of the transistor 2. Since the resistor 5 must not exceed the maximum value (e.g., 200 Ohms) the current I1 cannot be less than a minimum value, for instance 4 mA. The minimum power loss of the signal level converter is substantially determined by the current I2 and is relatively high.

Figure 2:
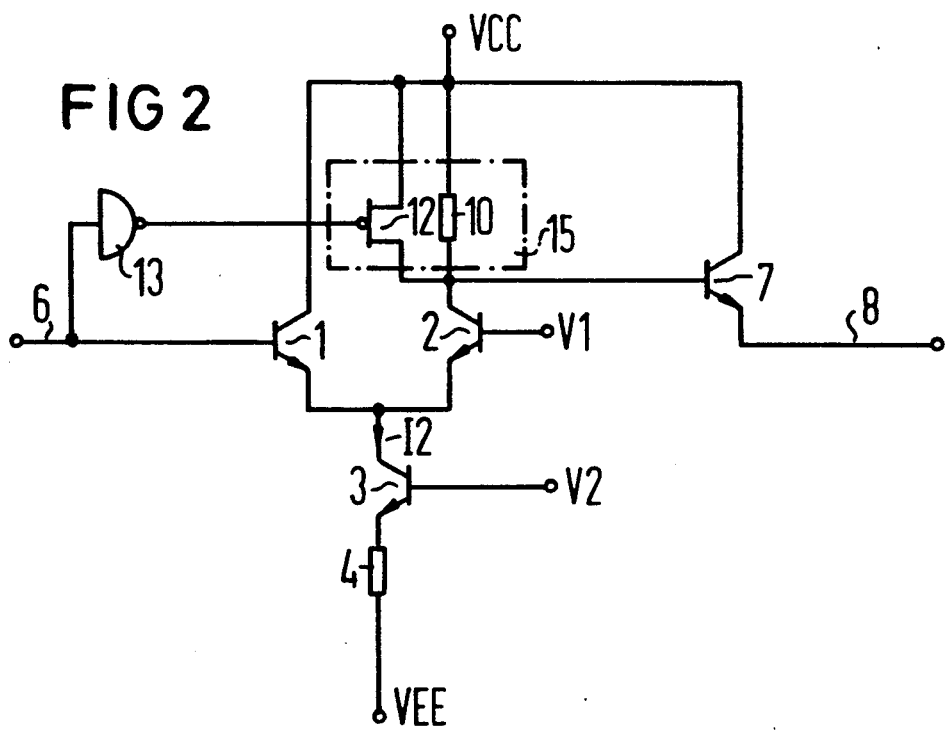
FIG. 2 is a circuit diagram of a signal level converter that is improved in accordance with the invention, with only a slight power loss.

FIG. 2 shows a signal level converter with only slight power loss, for converting CMOS input signals to ECL output signals. A controllable resistor 15 is provided in the collector circuit of the transistor 2. The controllable resistor 15 includes a parallel circuit of an ohmic resistor 10 and the drain-to-source path of a PMOS transistor 12. The gate electrode of the transistor 12 is connected to the input signal terminal 6 through an inverter 13.

When there is an L potential at the input signal terminal 6, the PMOS transistor 12 is blocked. The resistance of the parallel circuit 15 is then equal to that of the resistor 10. The level modulation for the L level at the output signal terminal 8, for instance from −0.9 V to −1.7 V, is effected by the voltage drop at the resistor 10 brought about by a current I2. The resistance of the resistor 10 is selected to be higher than that of the resistor 5 of FIG. 1. The current I2 can therefore be selected to be less than the current I1 of FIG. 1. This reduces the power loss.

When there is an H potential at the input signal terminal 6, the PMOS transistor 10 is conducting. It is dimensioned in such a way that the resistance of the parallel circuit 15 becomes 200 Ohms, for instance. This value is necessary for adapting the output signal terminal 8 to the wave resistance of the conductor track, as has been described in conjunction with FIG. 1.

The voltage drop at the base-to-emitter path of the transistor 7 decreases with increasing temperature. Thus the H or L level at the output signal terminal 8 rises accordingly. In FIG. 3, a current source is disposed between the base of the emitter follower transistor 7 and the potential VEE, for the sake of temperature compensation. The current source includes a transistor 20 and a controllable resistor 24 disposed on the emitter side of the transistor 20. The base of the transistor 20 is applied to a control potential V3. The controllable resistor 24 includes an ohmic resistor 21 and an NMOS transistor 23, having a gate electrode which is connected to the input signal terminal 6.

The temperature dependency of the control potential V3 and of the voltage drop at the base-to-emitter path of the transistor 20 is adjusted, in an already known manner, in such a way that a current I3 rises with increasing temperature. At the controllable resistor 15, it effects an additional voltage drop, which compensates for the temperature-dictated rise in the level at the output signal terminal 8. The additional voltage drop should be of equal magnitude for both the H and the L levels. Thus the current I3 must be high when the resistance of the controlled resistor 15 is low and low when this resistance is high. This can be attained by providing that the ratio of the resistances of the two controlled resistors 15 and 24 remain approximately constant for both the H and L levels. The NMOS transistor 23 serves the following purpose: when there is an L level at the input signal terminal 6, it is blocked, while at an H level it conducts and lowers the total resistance of the parallel circuit 24.

In IC manufacture, the problem of tolerances in the component parameters arises. With identical components of equal size, such as the resistors 10 and 12, an approximately constant ratio of the electrical parameters can be adhered to. With MOS transistors of different polarity, such as the NMOS transistor 23 and the PMOS transistor 12, this is no longer true as a rule.

In order to likewise compensate for the production-dependent variation in parameters of these two MOS transistors of different polarity, the circuit configuration of FIG. 4 is used. A third MOS (PMOS) transistor 25 and a fourth MOS (NMOS) transistor 26 have drain terminals connected to each other at a connecting point. A series-circuit of the one PMOS transistor 25 and the one NMOS transistor 26 is disposed between the supply voltage potentials VCC, VEE with the source terminals thereof being connected to the supply voltage potentials. The gate electrode of the transistor 25 is connected to the inverting input signal terminal 6. The transistor 26 is wired as a resistor, since its gate and drain electrodes are interconnected. The gate terminal of the transistor 23 is likewise applied to the drain electrode of the transistor 26.

For production reasons, the resistance of the drain-to-source path of the PMOS transistor 12 may, for instance, be higher, while the resistance of the drain-to-source path of the NMOS transistor 23 may be lower than intended. This is then also true for the drain-to-source paths of the transistors 25 and 26. Accordingly, for an H level at the input signal terminal 6, when the transistors 12, 23 and 25 are conducting, the result is the following: the flow of current through the drain-to-source paths of the transistors 25 and 26 brings about a voltage drop at the transistor 26. Due to the low resistance of the drain-to-source path of the transistor 26, the voltage drop will be less than the intended value. Due to the lower gate potential of the transistor 23, the resistance of its drain-to-source path is increased. The ratio between the resistances of the drain-to-source paths of the transistors 12, 23 is thus balanced once again. The same is true for the situation where the ratio of the resistances of the drain-to-source paths of the transistors 12, 25 or 23, 26 is reversed.

I claim:

1. A signal level converter for converting CMOS input signal levels to ECL output signal levels, comprising:

first and second transistors having bases and having collectors and emitters defining collector-to-emitter paths, the emitters of said first and second transistors being connected to each other, the collector of said first transistor being directly connected to a first supply voltage potential, a first controllable resistor connected between the collector of said second transistor and the first supply voltage potential, the base of said second transistor being connected to a reference potential, and said first resistor having a control electrode;

a third transistor having a base and having a collector and an emitter defining a collector-to-emitter path, the collector of said third transistor being connected to the emitters of said first and second transistors, a second resistor connected between the emitter of said third transistor and a second supply voltage potential, and the base of said third transistor being connected to a control potential;

a fourth transistor having a collector connected to the first supply voltage potential, a base connected to the collector of said second transistor and an emitter;

an input signal terminal connected to the base of said first transistor, an output signal terminal connected to the emitter of said fourth transistor;

an inverter having an input terminal and an output terminal, said input terminal of said inverter being connected to said input signal terminal, said output terminal of said inverter being connected to said control electrode of said controllable resistor; and a second controllable resistor having a control electrode connected to said input signal terminal, and a fifth transistor having a collector connected to the base of said fourth transistor, an emitter connected through said second controllable resistor to the second supply voltage potential and a base connected to a further control potential.

2. The signal level converter according to claim 1, wherein said second controllable resistor includes an ohmic resistor and an MOS transistor having a drain-to-source path forming a parallel circuit with said ohmic resistor and a gate electrode forming said control electrode of said second controllable resistor.

3. A signal level converter for converting CMOS input signal levels to ECL output signal levels, comprising:

first and second transistors having bases and having collectors and emitters defining collector-to-emitter paths, the emitters of said first and second transistors being connected to each other, the collector of said first transistor being directly connected to a first supply voltage potential, a first controllable resistor connected between the collector of said second transistor and the first supply voltage potential, the base of said second transistor being connected to a reference potential, and said first resistor having a control electrode;

a third transistor having a base and having a collector and an emitter defining a collector-to-emitter path, the collector of said third transistor being connected to the emitters of said first and second transistors, a second resistor connected between the emitter of said third transistor and a second supply voltage potential, and the base of said third transistor being connected to a control potential;

a fourth transistor having a collector connected to the first supply voltage potential, a base connected to the collector of said second transistor and an emitter;

an input signal terminal connected to the base of said first transistor, an output signal terminal connected to the emitter of said fourth transistor;

an inverter having an input terminal and an output terminal, said input terminal of said inverter being connected to said input signal terminal, said output terminal of said inverter being connected to said control electrode of said controllable resistor;

said first controllable resistor having a first ohmic resistor and a first MOS transistor with a drain-to-source path forming a parallel circuit with said first ohmic resistor and a gate electrode forming said control electrode of said first controllable resistor;

a second controllable resistor having a control electrode connected to said input signal terminal and having a second ohmic resistor and a second MOS transistor with a drain-to-source path forming a parallel circuit with said second ohmic resistor and with a gate electrode forming said control electrode of said second controllable resistor;

a fifth transistor having a collector connected to the base of said fourth transistor, an emitter connected through said second controllable resistor to the second supply voltage potential and a base connected to a further control potential;

third and fourth MOS transistor having drain and source terminals defining drain-to-source paths being connected in a series circuit at a connecting point, the source terminal of said third MOS transistor being connected to the first supply voltage potential, the source terminal of said fourth MOS transistor being connected to the second supply voltage potential;

the gate electrode of said first MOS transistor being connected to the gate electrode of said third MOS transistor;

the gate electrode of said second MOS transistor being connected to the connecting point between said third and fourth MOS transistors; and the gate and drain electrodes of said fourth MOS transistor being connected to one another.

4. The signal level converter according to claim 3, wherein said first and second MOS transistors having opposite polarities; and said third and fourth MOS transistors have the same polarities as said first and second MOS transistors.

5. The signal level converter according to claim 1, wherein each of said first and second controllable resistors includes an ohmic resistor and a MOS transistor having a drain-to-source path forming a parallel circuit with said ohmic resistor and a gate electrode forming said control electrode of a respective one of said first and second controllable resistors.

* * * * *